United States Patent
Walker

(10) Patent No.: US 7,230,876 B2
(45) Date of Patent: Jun. 12, 2007

(54) REGISTER READ FOR VOLATILE MEMORY

(75) Inventor: Robert Michael Walker, Raleigh, NC (US)

(73) Assignee: Qualcomm Incorporated, San Diego, CA (US)

( * ) Notice: Subject to any disclaimer, the term of this patent is extended or adjusted under 35 U.S.C. 154(b) by 157 days.

(21) Appl. No.: 11/128,829

(22) Filed: May 13, 2005

(65) Prior Publication Data

US 2006/0181957 A1    Aug. 17, 2006

Related U.S. Application Data

(60) Provisional application No. 60/653,020, filed on Feb. 14, 2005.

(51) Int. Cl.
G11C 8/00 (2006.01)

(52) U.S. Cl. .......... 365/233; 365/222; 257/68; 327/41; 369/47.48; 710/35; 710/61

(58) Field of Classification Search ........ 365/233, 365/222; 257/58; 327/41; 369/47.48; 710/35, 710/61

See application file for complete search history.

(56) References Cited

U.S. PATENT DOCUMENTS

| 6,401,213 B1 * | 6/2002 | Jeddeloh ............... 713/401 |
|---|---|---|
| 6,728,798 B1 * | 4/2004 | Roohparvar ............ 710/35 |
| 7,096,283 B2 * | 8/2006 | Roohparvar ............ 710/14 |
| 2003/0095455 A1 | 5/2003 | Dono et al. |
| 2003/0174568 A1 | 9/2003 | Blodgett |
| 2005/0060481 A1 * | 3/2005 | Belonoznik ............ 710/315 |

FOREIGN PATENT DOCUMENTS

EP      0797207       9/1996

* cited by examiner

Primary Examiner—Richard T. Elms
Assistant Examiner—Eric J. Wendler
(74) Attorney, Agent, or Firm—Nicholas J. Pauley; Thomas Rouse

(57) ABSTRACT

Data not stored in the DRAM array of a SDRAM module is read from the SDRAM module in a synchronous data transfer. The data transfer, referred to as register read command/operation, resembles a read command/operation directed to data stored in the DRAM array in timing and operation. The register read command is distinguished by a unique encoding of the SDRAM control signals and bank address bits. In one embodiment, the register read command comprises the same control signal states as a MSR or EMSR command, with the bank address set to a unique value, such as 2'b10. The register read command may read only a single datum, or may utilize the address bus to address a plurality of data not stored in the DRAM array. The register read operation may be a burst read, and the burst length may be defined in a variety of ways.

35 Claims, 4 Drawing Sheets

REGISTER READ FOR VOLATILE MEMORY

RELATED APPLICATION

This application claims priority to U.S. Provisional Application No. 60/653,020 filed Feb. 14, 2005.

BACKGROUND

The present invention relates generally to the field of memory and in particular to a method of reading a register from a volatile memory module.

Portable electronic devices have become ubiquitous accoutrements to modern life. Two modern trends in portable electronic devices are increased functionality and decreased size. Increased functionality demands higher computing power and more memory. The decreasing size of portable electronic devices places a premium on power consumption, as smaller batteries can store and deliver less power. Thus, advances that increase performance and decrease power consumption are advantageous for portable electronic devices.

Most portable electronic devices include Dynamic Random Access Memory (DRAM) to store instructions and data for a processor or other controller. DRAM is the most cost-effective solid-state memory technology available. While the price per bit is lower for mass storage technologies such as disk drives, the high access latency, high power consumption, and high sensitivity to shock or vibration preclude the use of mass storage drives in many portable electronic device applications.

Synchronous DRAM (SDRAM) offers both improved performance and simplified interface design over conventional DRAM by aligning all control signals and data transfer cycles to clock edges. Double data rate (DDR) SDRAM allows data transfers on both rising and falling edges of the clock, providing still higher performance.

Most SDRAM modules include a mode register to store configurable parameters such as CAS latency, burst length, and the like. As SDRAM technology increased in complexity and configurability, many SDRAM modules added an extended mode register to store additional configurable parameters such as write length, drive strength, and the like. Both the mode register and extended mode register are write-only. That is, there is no provision for a controller to read the contents of these registers. With the introduction of the mode and extended registers, a DRAM module for the first time stored information other than the data written to and read from the DRAM array. Consequently, a new data transfer operation was required.

Many SDRAM modules include Mode Register Set (MRS) and Extended Mode Register Set (EMRS) operations to load the registers with the desired parameters. These operations are commonly implemented by simultaneously driving the CS, RAS, CAS, and WE control signals low, selecting between the MRS and EMRS with bank address bits, and providing the information to be written to the selected register on address lines A0–A11. In most implementations, all DRAM banks must be inactive at the time of the MRS or EMRS command, and no further operation may be directed to the SDRAM module for a specified minimum duration, such as six clock cycles. These restrictions do not adversely impact the SDRAM performance, since due to the nature of the mode and extended mode registers, they are written once upon initialization and never changed.

The third-generation Graphics Double Data Rate industry specification (GDDR3) provides the ability to read information from an SDRAM module other than data stored in the DRAM array. As one option during an EMRS operation, the SDRAM may output a vendor code and version number on the data bus (EMRS write information is transmitted on the address bus). All of the restrictions of the EMRS operation—that all banks be idle and that the operation is followed by a minimum duration, such as six clock cycles, of inactivity—must be observed. Due to the static nature of the information (vendor ID and version number), it only needs to be read once, such as during initialization, and the limitations of the EMRS operation do not significantly affect performance.

A basic aspect of DRAM operation is that the capacitive charge storing data at each bit position must be periodically renewed to preserve the data state. The DRAM array is refreshed by row; some SDRAM modules may refresh the same row in multiple DRAM banks at the same time. Each row in the DRAM array must be refreshed within a specified refresh period. The DRAM rows may be refreshed sequentially once per refresh period, known as a burst refresh. However, this prevents access to the DRAM array for the time necessary to cycle through all of the rows, and imposes a performance degradation. Alternatively, refresh cycles directed to each row may be spread evenly throughout the refresh period, interspersed with read and write data transfers. This is known as distributed refresh. Distributed refresh is more commonly implemented, as it imposes less of a performance penalty.

The total required refresh period, and hence the spacing of refresh cycles in a distributed refresh operation, depends on the temperature of the DRAM array dye. As a general rule of thumb, the refresh rate must be doubled for every 10° C. increase in the DRAM array die temperature. The refresh period specified for a SDRAM module is typically that required by the DRAM at its highest anticipated operation temperature. Thus, whenever the DRAM array die is at a lower temperature, the refresh period is longer, and the distributed refresh cycles may be spaced further apart, thus reducing their impact on DRAM read and write accesses. This would both improve processor performance and reduce power consumption by eliminating unnecessary refresh activity.

Co-pending U.S. Pat. Appl. Ser. No. 11/165,950, filed on Jun. 23, 2005, assigned to the assigneee of the present invention and incorporation herein by reference in its entirety, discloses a SDRAM module having a temperature sensor. A controller, such as a processor, may periodically read the output of the temperature sensor and calculate the actual minimum required refresh rate. At least during initial operation—that is, before the SDRAM module stabilizes at its operating temperature—the controller may periodically read the temperature sensor, such as every four to six microseconds, to dynamically optimize the refresh rate.

The output of a temperature sensor is one form of data read from a SDRAM module that is not stored in the DRAM array. The only known means for reading such information—"piggy backing" the read of vendor ID and version number on an EMRS operation, as provided in the GDDR3 specification—imposes unacceptable performance penalties. As described, in most implementations, all banks must be idle prior to the EMRS operation, and no commands may be issued for many clock cycles after the EMRS operation. Ideally, the read of data not stored in the DRAM array should be performed in a synchronous data transfer that is substantially similar to a read operation directed to data that is within the DRAM array. This would allow the read of information not stored in the DRAM array to be seamlessly interspersed with reads and writes of data that is stored in the DRAM array (i.e., normal DRAM accesses).

SUMMARY

In one or more embodiments, data not stored in the DRAM array of a SDRAM module is read from the SDRAM module in a synchronous data transfer. The data transfer, referred to as register read command/operation, resembles a read command/operation directed to data stored in the DRAM array in timing and operation. The register read command is distinguished by a unique encoding of the SDRAM control signals and bank address bits. In one embodiment, the register read command comprises the same control signal states as a MSR or EMSR command, with the bank address set to a unique value, such as 2'b10. The register read command may read only a single datum, or may utilize the address bus to address a plurality of data not stored in the DRAM array. The register read operation may be a burst read, and the burst length may be defined in a variety of ways.

One embodiment relates to a method of reading data from a SDRAM module, that is not stored in a DRAM array. Control signals are output for a synchronous read of data from a DRAM array with a unique encoding of control signals, and the data not stored in a DRAM array are synchronously read.

Another embodiment relates to an SDRAM memory module including a DRAM array and a register. The module also includes control circuits operative to perform synchronous data transfers with a controller and to read and write data from and to the DRAM array. The control circuits are further operative to output to the controller, in a synchronous data transfer, data not stored in the DRAM array.

DETAILED DESCRIPTION

Figure 1:
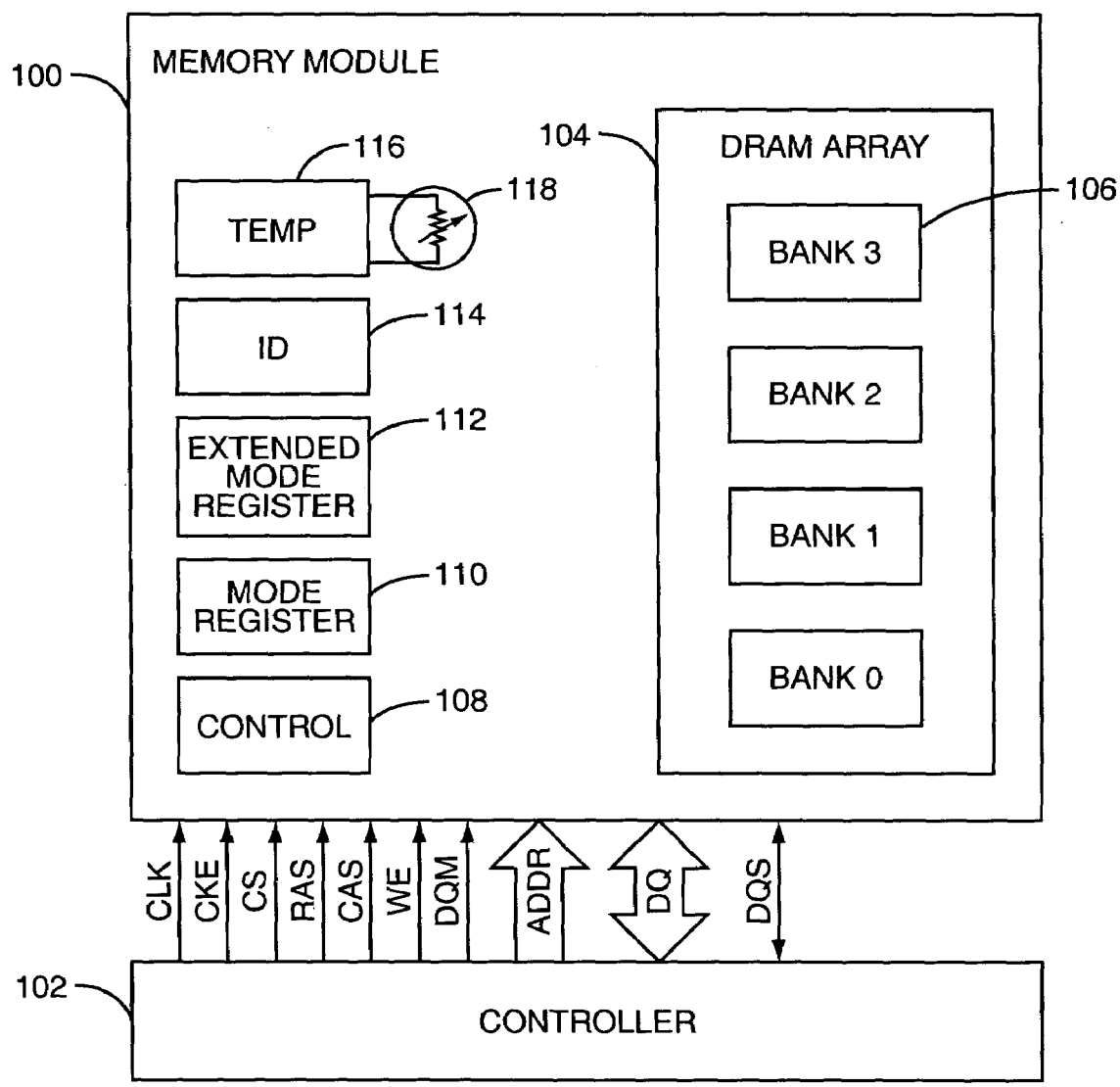
FIG. 1 is a functional block diagram of a processor.

FIG. 1 depicts a SDRAM memory module 100 and a controller 102. The controller may comprise a processor, digital signal processor, micro controller, state machine, or the like. The controller 102 directs operations to the SDRAM module 100 by control signals Clock (CLK), Clock Enable (CKE), Chip Select (CS), Row Address Strobe (RAS), Column Address Strobe (CAS), Write Enable (WE), and Data Qualifiers (DQM) as well known in the art. The controller 102 provides a plurality of address lines to the SDRAM module 100 and a bi-directional data bus connects the two. The SDRAM module includes a DRAM array 104, which may be divided into a plurality of banks 106. The DRAM array stores instructions and data, and is read from, written to, and refreshed by control circuit 108, under the direction of the controller 102.

The SDRAM module 100 additionally includes a mode register 110 and extended mode register 112. The SDRAM module 100 may additionally include identification information 114, such as vendor ID and version number. The identification information 114 may be stored in a register; alternatively, it may be hardwired into the die.

The SDRAM module 100 additionally includes a temperature sensing circuit 116, including one or more temperature sensors such as a thermister 118 disposed adjacent the DRAM array 104 and operative to sense the temperature of the DRAM array dye. The contents of the mode register 110 and extended mode register 112, the SDRAM module identification 114 and the output of the temperature sensor 116 are all examples of data that may be read from the SDRAM module 100, but that are not stored in the DRAM array 104. According to one or more embodiments, an operation is defined that effects a synchronized read of data not stored in the DRAM array 104.

SDRAM operations are defined by the state of the control signals applied to the SDRAM module 100 by the controller 102 on a rising clock edge. Common SDRAM operations are defined in the truth table below, where X indicates a "don't care" state.

TABLE 1

Representative SDRAM Commands and Control Signals

| CS | RAS | CAS | WE | ADDR | BANK | Command |
|---|---|---|---|---|---|---|
| H | X | X | X | X | X | Command Inhibit (SDRAM not selected) |
| L | H | H | H | X | X | NOP |
| L | L | H | H | row | bank | Active (row select) |
| L | H | L | H | col. | bank | Read (data in DRAM array) |
| L | H | L | L | col. | bank | Write (data in DRAM array) |
| L | H | H | L | X | X | Burst Terminate |
| L | L | H | L | row | bank | Precharge (deactivate row) |
| L | L | L | H | X | X | Auto Refresh or Self Refresh |
| L | L | L | L | write data | 2'b00 | Mode Register Set (MSR) |
| L | L | L | L | write data | 2'b01 | Extended Mode Register Set (EMSR) and optional Vendor ID and version read for GDDR3-compliant SDRAM. |

According to one or more embodiments, the following operation is defined to read data not stored in the DRAM array:

TABLE 2

Single Register Read Command and Control Signals

| CS | RAS | CAS | WE | ADDR | BANK | Command |
|---|---|---|---|---|---|---|
| L | L | L | L | X | 2'b10 | Register Read |

The operation to read data not stored in DRAM array is referred to herein as a "register read," although the operation is not limited to reading data from an actual register. For example, the output of the temperature sensing circuit 116 and the hardwired SDRAM module ID information 114 may be read with a register read command, although neither datum may reside in an actual register on the SDRAM module 100.

In one embodiment, in a register read operation, the SDRAM module ID information 114 is driven on data bus bits DQ[3:0]. The SDRAM module ID information 114 may be in the form of the Vendor ID as specified in the GDDR3 standard. The ability to read the Vendor ID may be particularly useful in "stacked chip" applications, wherein two or more semiconductor dice are stacked with intervening dielectric layers, with wirebonded interconnections, and packaged in the same integrated circuit housing. For example, a processor and a SDRAM die may be stacked in a package. In these applications, if the vendor is not known, it may be impossible to ascertain without being able to read the information electronically from the SDRAM device itself.

In one embodiment, information generated by the temperature sensing circuit 116 is driven on data bus bits DQ[10:8]. In one embodiment, the temperature information may be expressed as a refresh rate multiplier, as defined in the following table.

TABLE 3

Representative Refresh Rate Multiplier Encoding

| DQ[10:8] | Refresh Rate Multiplier |
| --- | --- |
| 111 | Out of Range |
| 110 | 4× |
| 101 | 2× |
| 000 | 1× |
| 001 | ½× |
| 010 | ¼× |
| 011 | Out of Range |

The SDRAM module ID information 114 and output of the temperature sensing circuit 116 may be simultaneously driven on the data bus during a register read operation. Note that the address bus is not utilized in this embodiment of the register read command; the read is always directed to a single datum, such as a read-only status register.

In another embodiment, the read register command is not limited to reading a single datum. In general, the read register command may be used to read any data from the SDRAM module 100 that is not stored in the DRAM array 104. This may include the output of the temperature sensing circuit 116, the SDRAM module ID information 114, the contents of the mode register 110 or extended mode register 112, or other registers or non-registered data sources that may be added to an SDRAM module 100 in the future. In this embodiment, at least some bits of the address bus are not considered "don't care" signals, but rather transmit the address of the source of the read register command data. The following table depicts the control signals for the general case of a register read command.

TABLE 4

General Register Read Command and Control Signals

| CS | RAS | CAS | WE | ADDR | BANK | Command |
| --- | --- | --- | --- | --- | --- | --- |
| L | L | L | L | non-DRAM addr | 2'b10 | Register read of data not stored in the DRAM array, selected by the address non-DRAM addr |

Regardless of how many non-DRAM array data sources the register read command may access, a register read proceeds in all cases as a synchronous data transfer from the SDRAM module 100 to the controller 102. As used herein, a "synchronous data transfer" is a SDRAM data transfer that complies with the timing parameters and restrictions of a conventional SDRAM data transfers of data stored in a DRAM array. As used herein, "synchronously reading" data means reading data in a synchronous data transfer. The register read operation complies with normal read operation pin level timings. That is, the timing and restrictions of register read operation preceding and following normal read and write operations are the same as those defined for normal read operation, as summarized in the following table.

TABLE 5

Comparison of Register Read and DRAM Array Read Timing and Restrictions

| Register Read Operation Combinations | Timing and Restrictions Same As . . . |
| --- | --- |
| read –> register read | read –> read |
| register read –> read | read –> read |
| write –> register read | write –> read |
| register read –> write | read –> write |

Figure 2:
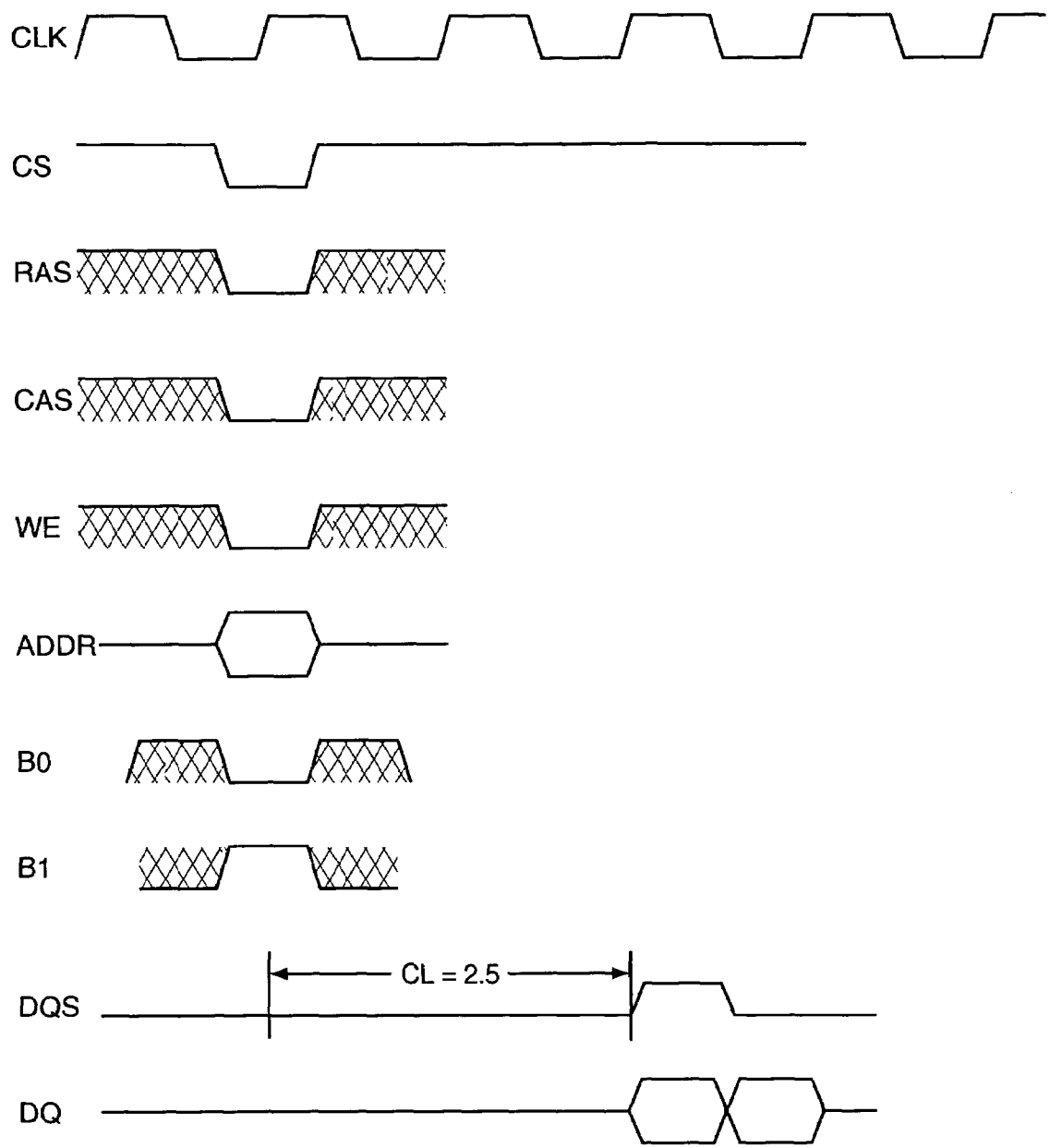
FIG. 2 is a timing diagram of a register read operation.

FIG. 2 is a timing diagram showing a single register read operation for a DDR SDRAM module 100. In this case, the CAS latency is 2.5 and the burst length is two. The read register command is presented by the controller 102 to the SDRAM module 100 by placing the CS, RAS, CAS, and WE control signals in the state depicted above in Tables 2 and 4 at the rising edge of clock cycle two, and also placing the value 2'b10 on the bank address bits. In the embodiment that register read operation may read more than a single status register, an address is additionally driven on the address bus at this time. Following a delay determined by the CAS latency value stored in the mode register 110, the SDRAM module 100 drives the data on the data bus, and drives the data strobe DQS. In the embodiment depicted in FIG. 2, the register read operation is a burst read, the burst length of which is determined by the burst length parameter stored in the mode register 110. In other embodiments, the burst length may be determined in a variety of ways.

In one embodiment, the register read operation has a default burst length, independent of the burst length parameter stored in the mode register 110. In another embodiment, a register read burst length parameter is defined, and the value written to the mode register 110, extended mode register 112, or other mode register on the SDRAM module 100. Register read operations are then always the stored burst length. In another embodiment, the burst length for each register read operation may be communicated to the SDRAM module 100 by the controller 102 at the time of the read register command, by encoding a burst length value on one or more unused control signals, such as for example high order address bits.

Figure 3:
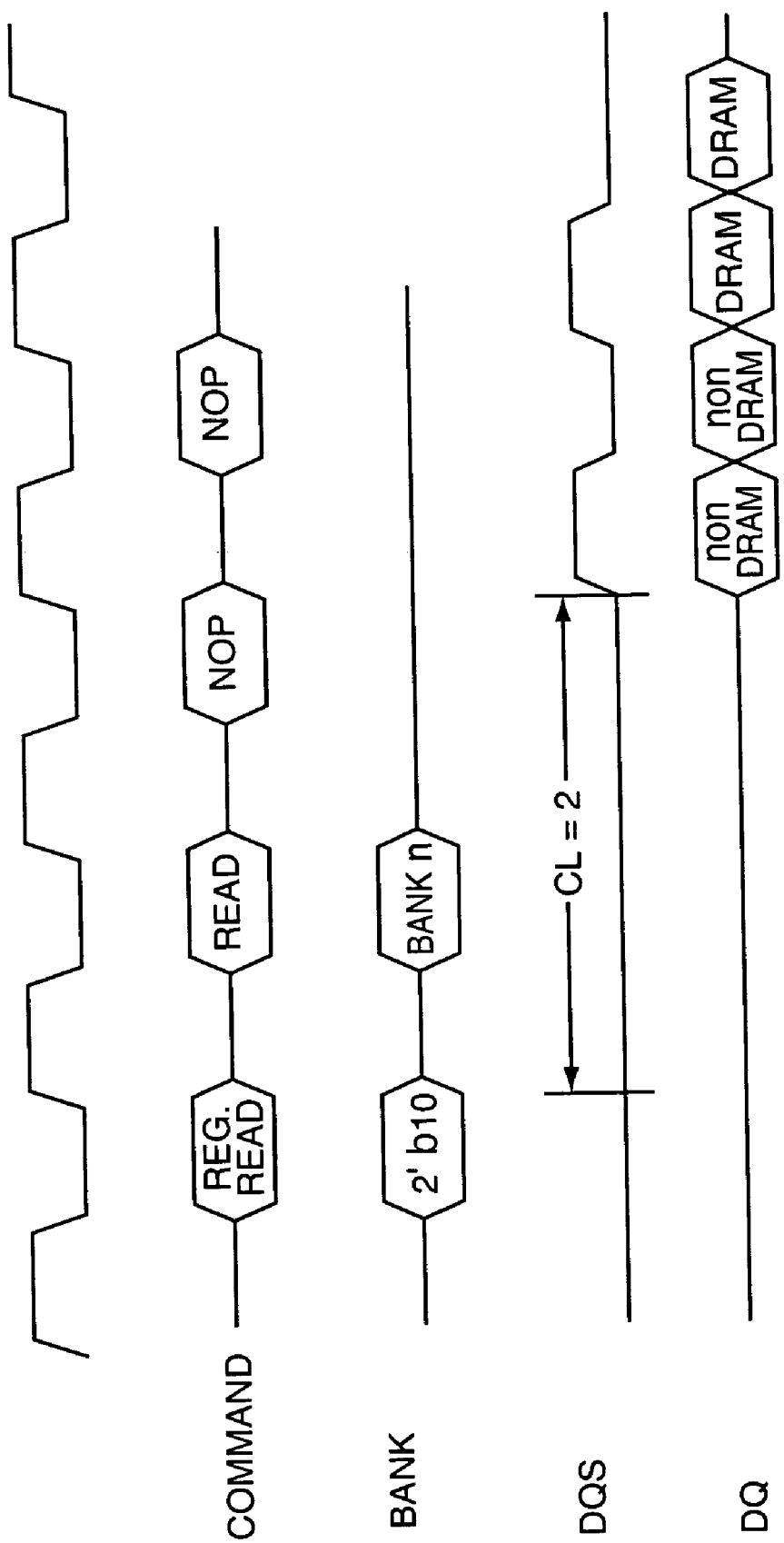
FIG. 3 is a timing diagram of a register read followed by a read.
Figure 4:
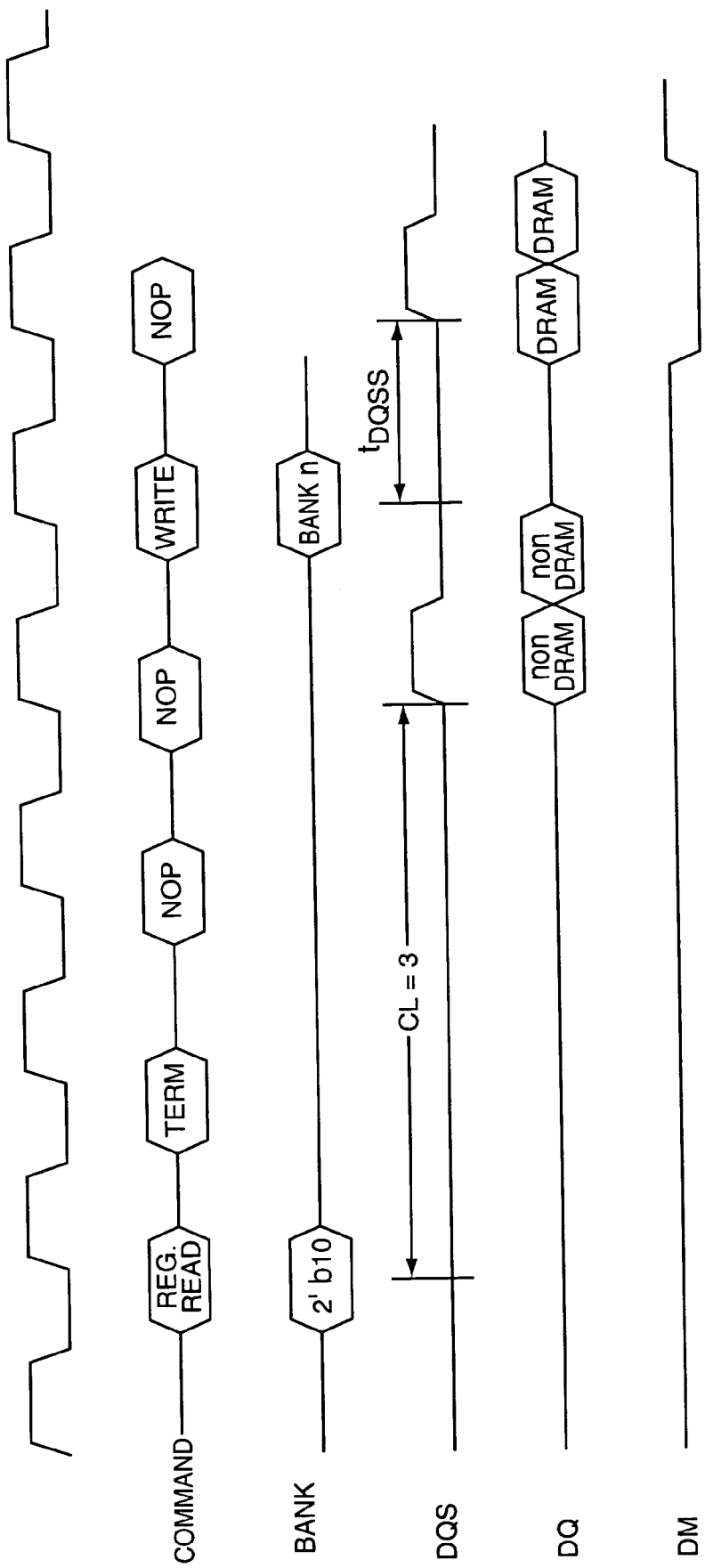
FIG. 4 is a timing diagram of a terminated register read burst followed by a write.

FIGS. 3 and 4 are representative timing diagrams demonstrating how the register read operation may be seamlessly integrated into regular SDRAM read and write operations. FIG. 3 depicts a register read followed by a regular read, where both of the read operations have a burst length of two. In this case, the CAS latency is two. Two cycles of non-DRAM data (that is, data read from the SDRAM module 100 that is not stored in the DRAM array 104) are followed by two cycles of data read from the DRAM array 104. In the embodiment that the register read operation accesses only one location (i.e. the address bus is unused), the second transfer of non-DRAM data (or subsequent transfers, for a longer burst length) may be a replica of the first transfer. Alternatively, the second and any subsequent burst transfers may be 0's, or any other predetermined value.

FIG. 4 depicts a register read operation wherein the burst transfer is terminated and followed by a write of data to the DRAM array 104. In this case, the register read operation has a CAS length of three. The burst length is at least two.

The register read burst is terminated at a length of two by a burst terminate command following the register read command. A write of data to the DRAM array 104 follows the transfer of data read from the SDRAM module 100 that was not stored in the DRAM array 104. The controller 102 drives data to be written to the DRAM array 104 on the DQ bus according to the timing parameter $t_{DQSS}$, in the same manner as if the write followed a read of data from the DRAM array 104.

The examples depicted in FIGS. 3 and 4 are representative only. In general, the register read operation conforms in all respects (other than the state of control signals and bank address bits at the time the command is issued) to a conventional SDRAM read operation. Accordingly, data not stored in the DRAM array 104 may be read from the SDRAM module 100 at any time, with minimal impact on reads and writes from and to the DRAM array 104.

The term "module" is used herein in a general sense to denote a functional SDRAM unit that includes a DRAM array 104 and control circuits 108. In particular, the term "module" is not restricted to industry standard identifiers that include the term, such as Single In-line Memory Module (SIMM) or Dual In-line Memory Module (DIMM).

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A method of reading data from a SDRAM (Synchronous Dynamic Access Ram) module, that is not stored in a DRAM Dynamic Access Ram) array, comprising:
   providing control signals for a synchronous read of data from a DRAM array with a unique encoding of control signals; and
   synchronously reading the data not stored in a DRAM array.

2. The method of claim 1 wherein synchronously reading the data not stored in a DRAM array comprises synchronously reading the data not stored in a DRAM array when a DRAM row is open.

3. The method of claim 1 wherein the data not stored in a DRAM array comprises the contents of a register.

4. The method of claim 3 wherein the register is a MSR (Mode Register Set) or EMSR (Extended Mode Register Set).

5. The method of claim 1 wherein the data not stored in a DRAM array comprises the output of a sensor.

6. The method of claim 5 wherein the sensor is a temperature sensor and wherein the data not stored in a DRAM array is indicative of the internal temperature of the memory module.

7. The method of claim 6, wherein the data not stored in a DRAM array is a refresh rate multiplier.

8. The method of claim 6, further comprising adjusting a refresh rate in response to the temperature of the memory module.

9. The method of claim 1 wherein the data not stored in a DRAM array is hardwired in the memory module.

10. The method of claim 1 wherein the unique encoding of control signals is the encoding for a write of a register, with a bank address distinct from any bank address defined for a register write.

11. The method of claim 10 wherein the RAS, CAS, and WE control signals are low, and wherein the bank address is 2'b10.

12. The method of claim 1, further comprising reading or writing data from or to a DRAM array immediately before or after reading the data not stored in a DRAM array.

13. The method of claim 1 where synchronously reading the data not stored in a DRAM array comprises reading the data not stored in a DRAM array in a burst.

14. The method of claim 13 wherein the burst length is determined by the burst length for synchronous reads of data stored in the DRAM array.

15. The method of claim 13 further comprising programming a burst length for read bursts of data not stored in a DRAM array in a register on the memory module, that is different than the burst length for synchronous reads of data stored in the DRAM array, and wherein the burst length is the programmed burst length for read bursts of data not stored in a DRAM array.

16. The method of claim 13 wherein the burst length is a predetermined default value, independent of a burst length for read bursts of data stored in a DRAM array that is programmed into a register on the memory module.

17. The method of claim 13 wherein the burst length is encoded in control signals output to the memory module.

18. The method of claim 13 wherein the burst length is encoded in unused address bits.

19. An SDRAM memory module, comprising:
   a DRAM array;
   a register; and
   control circuits operative to perform synchronous data transfers with a controller and to read and write data from and to the DRAM array, the control circuits further operative to output to the controller, in a synchronous data transfer, data not stored in the DRAM array.

20. The memory module of claim 19 wherein the control circuits are operative to output data not stored in the DRAM array to the controller in a synchronous data transfer when a row of the DRAM array is open.

21. The memory module of claim 19 wherein the synchronous data transfer includes a unique encoding of control signals from the controller.

22. The memory module of claim 21 wherein the unique encoding of control signals is the encoding for a write of a register, with a bank address distinct from any bank address defined for a register write.

23. The memory module of claim 22 wherein the RAS, CAS, and WE control signals are low, and wherein the bank address is 2'b10.

24. The memory module of claim 19 wherein the synchronous data transfer is a burst transfer.

25. The memory module of claim 24 wherein the register stores a burst length for read transfers of data from the DRAM array, and wherein the burst length for the synchronous data transfer of data not stored in a DRAM array is determined by the stored burst length.

26. The memory module of claim 24 wherein the register stores a burst length for read transfers of data not from the DRAM array, and wherein the burst length for the synchronous data transfer of data not stored in a DRAM array is determined by the stored burst length for read transfers of data not from the DRAM array.

27. The memory module of claim 24 wherein the burst length is a predetermined default value, independent of any burst length stored in a register.

28. The memory module of claim 24 wherein the burst length is encoded in the control signals from the controller.

29. The memory module of claim 24 wherein the burst length is encoded in unused address bits.

30. The memory module of claim 19 wherein the data not stored in the DRAM array comprises the contents of the register.

31. The memory module of claim 19 wherein the data not stored in the DRAM array is hardwired in the memory module.

32. The memory module of claim 19 further comprising a sensor, and wherein the data not stored in the DRAM array comprises the output of the sensor.

33. The memory module of claim 32 wherein the sensor is a temperature sensor, and wherein the data not stored in the DRAM array represents the internal temperature of the memory module.

34. The memory module of claim 33 wherein the data not stored in the DRAM array is a refresh rate multiplier.

35. The memory module of claim 19 wherein the control circuits are operative to perform synchronous transfers of data from or to the DRAM array immediately before or after outputting to the controller data not stored in the DRAM array.

* * * * *